United States Patent [19]

Chiu

[11] Patent Number: 5,856,003
[45] Date of Patent: Jan. 5, 1999

[54] METHOD FOR FORMING PSEUDO BURIED LAYER FOR SUB-MICRON BIPOLAR OR BICMOS DEVICE

[75] Inventor: Tzu-Yin Chiu, Hsin-Chu, Taiwan

[73] Assignee: Taiwan Semiconductor Manufacturing Company, Ltd., Hsin-chu, Taiwan

[21] Appl. No.: 971,669

[22] Filed: Nov. 17, 1997

[51] Int. Cl.$^6$ .................................................. H01L 21/331

[52] U.S. Cl. .......................... 438/362; 438/202; 438/297; 438/298; 438/308; 438/225; 438/370; 438/378; 438/526; 438/530; 438/555; 438/771; 438/756; 438/757; 438/788; 438/792; 438/795

[58] Field of Search ..................................... 438/202, 297, 438/298, 308, 309, 225, 362, 370, 378, 526, 530, 555, 791, 770, 771, 756, 757, 787, 788, 792, 795; 148/DIG. 9, DIG. 10, DIG. 11

[56] References Cited

U.S. PATENT DOCUMENTS

| | | | |
|---|---|---|---|
| 4,508,757 | 4/1985 | Fabricius et al. | 427/93 |
| 4,902,639 | 2/1990 | Ford | 437/56 |
| 5,326,710 | 7/1994 | Joyce et al. | 437/31 |
| 5,580,798 | 12/1996 | Grubisich | 437/34 |

OTHER PUBLICATIONS

S. Wolf, "Silicon Processing For The VLSI Era" vol. 2, Lattice Press, Sunset Beach, CA, 1990, pp. 531, 586.

Primary Examiner—John F. Niebling
Assistant Examiner—Long W. Pham
Attorney, Agent, or Firm—George O. Saile; Stephen B. Ackerman

[57] ABSTRACT

A process is described for forming a heavily doped buried element below an active device region of a silicon wafer without the use of costly epitaxial layers and without incurring ion implantation damage within active device regions. The method is particularly applicable to active device regions which have small lateral dimensions. Thus, the technological trend towards shrinking devices favors the incorporation of the process of the invention. The process utilizes a silicon nitride hardmask to define a narrow band around the perimeter of the device active area. A deep implant is performed through this mask, placing a ring of dopant below and outside the active area. The silicon nitride hardmask is then patterned a second time to define the conventional field oxide isolation regions. The LOCOS field oxidation is then performed whereby the implanted dopant diffuses vertically, engaging the field oxide around the perimeter of the device region and laterally filling in the region under the device active area. The novel process is used to the form buried collectors for high performance bipolar transistors including BiCMOS applications.

15 Claims, 9 Drawing Sheets

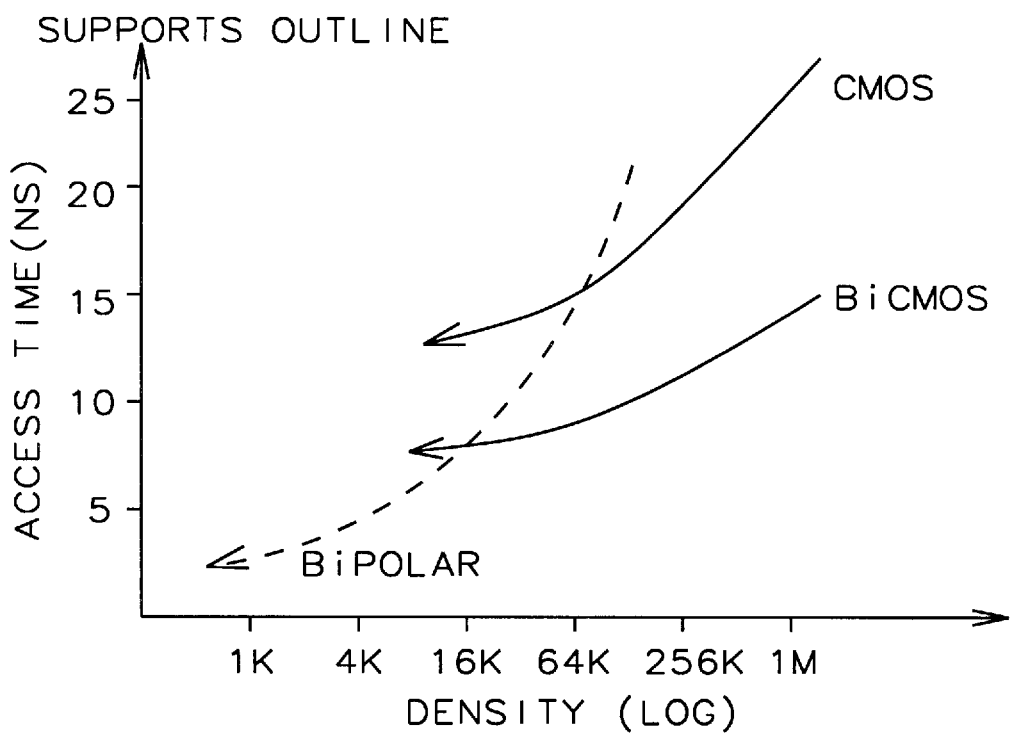
FIG. 1 - Prior Art
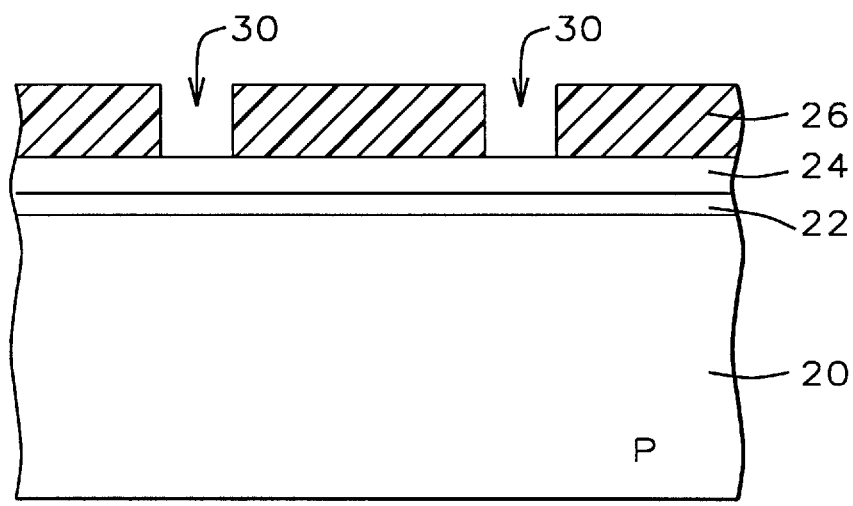
FIG. 2

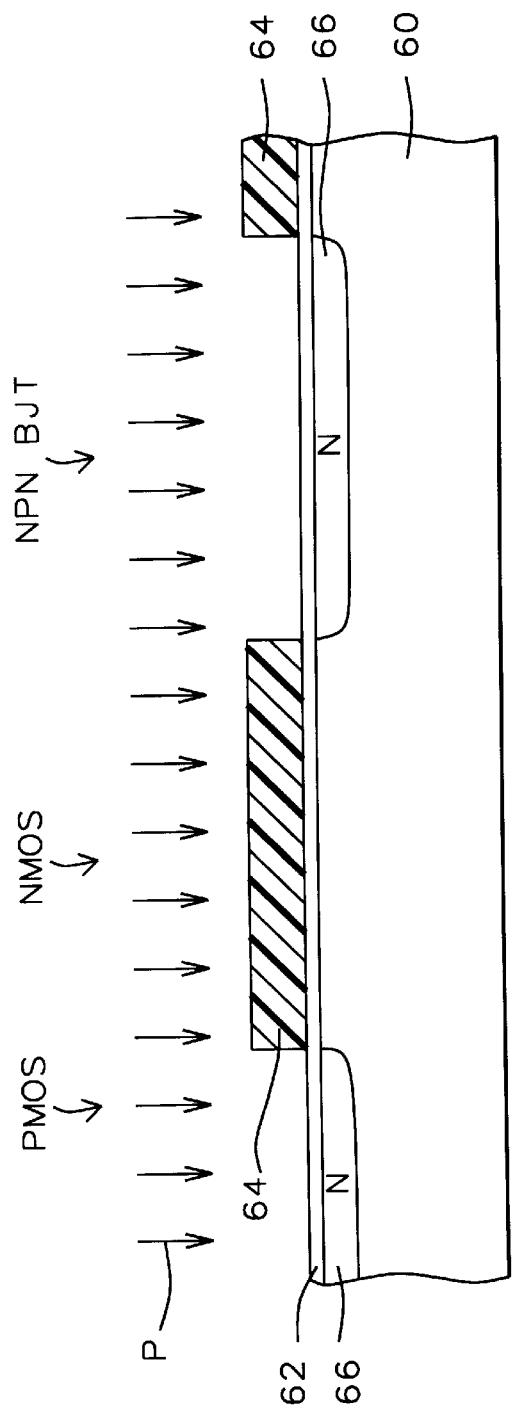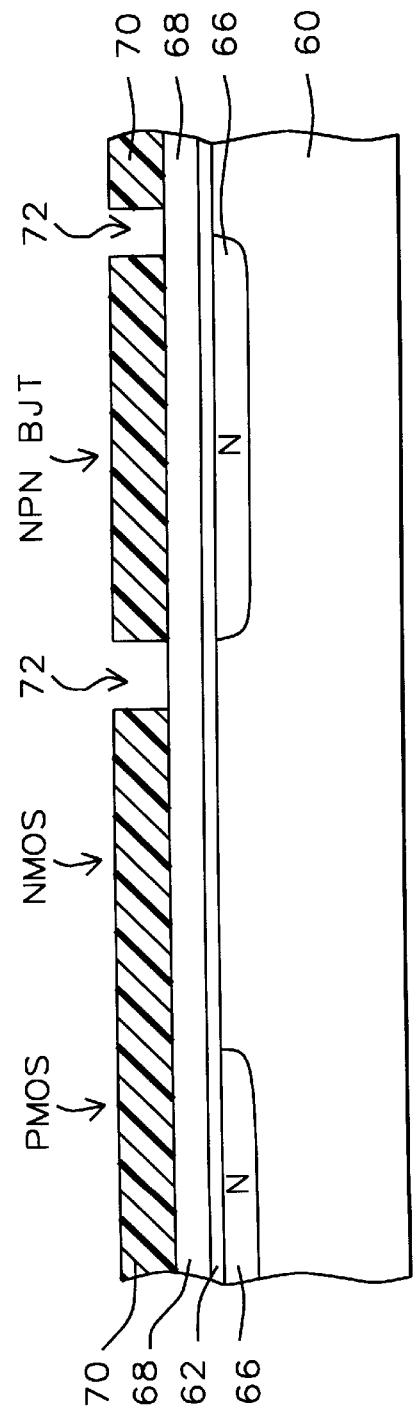

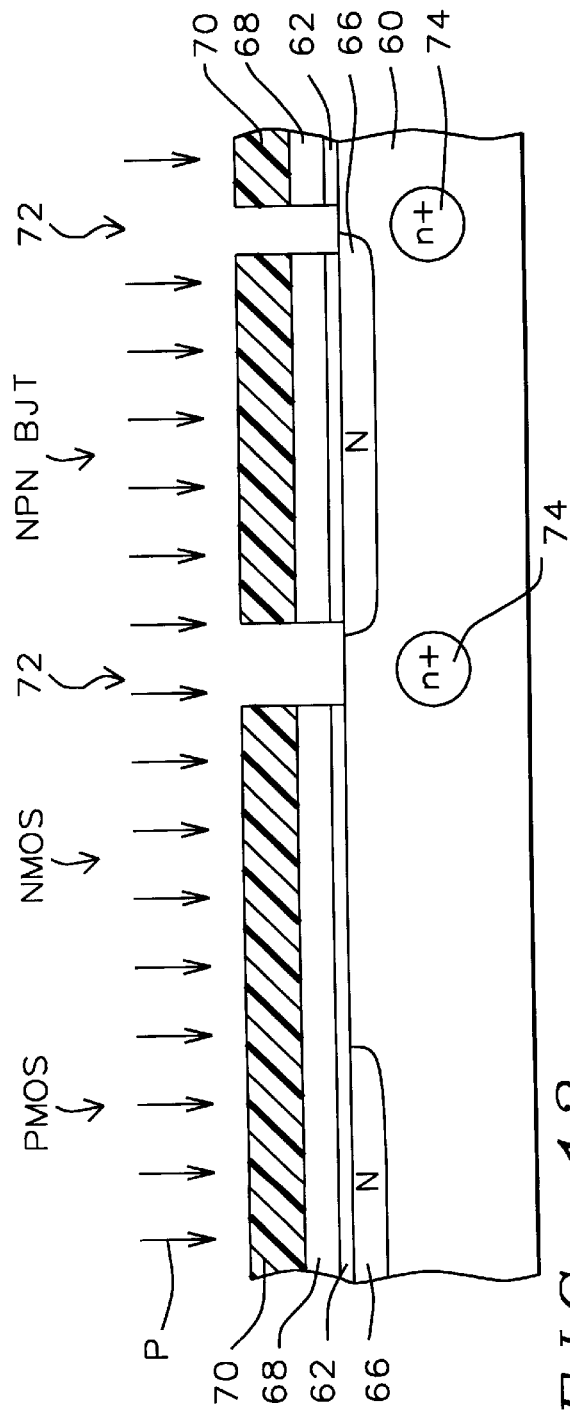
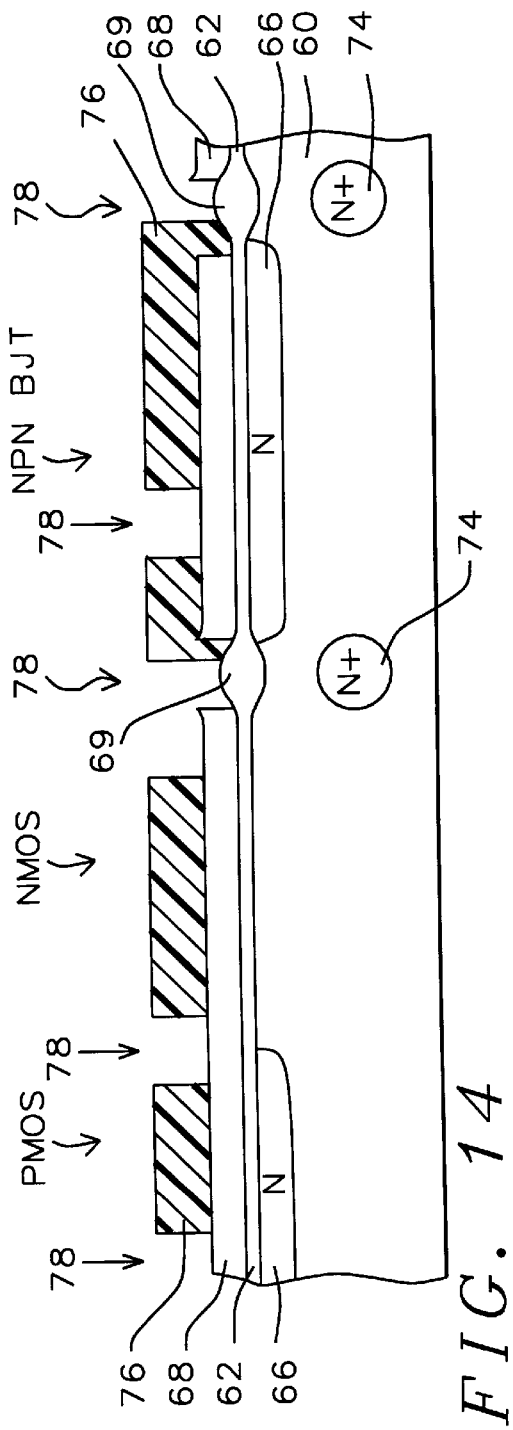
FIG. 13
FIG. 14

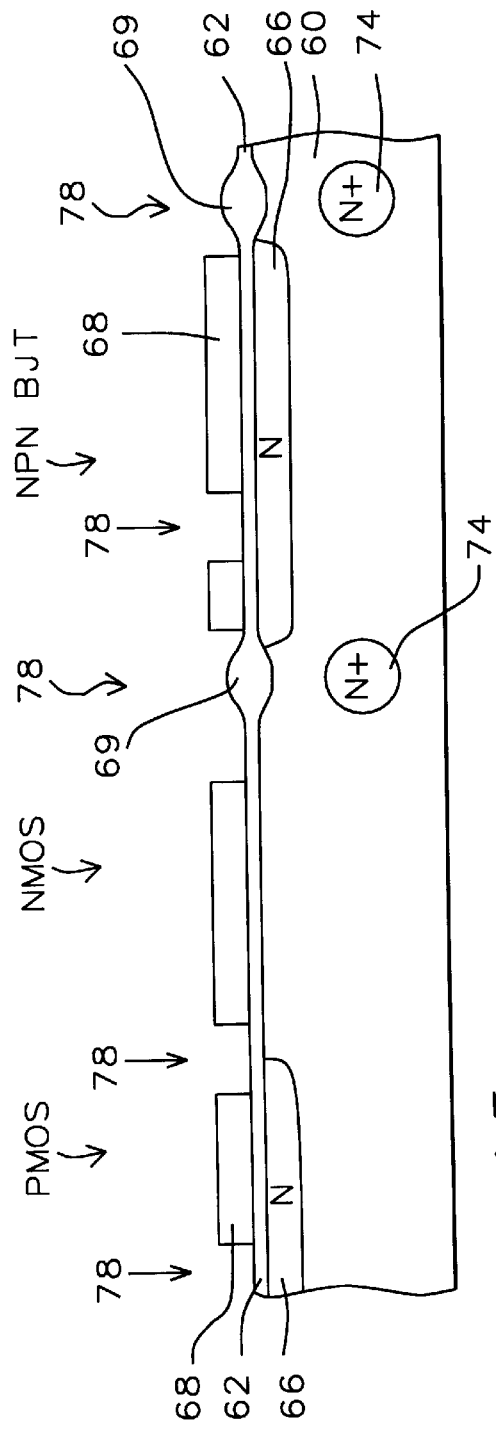
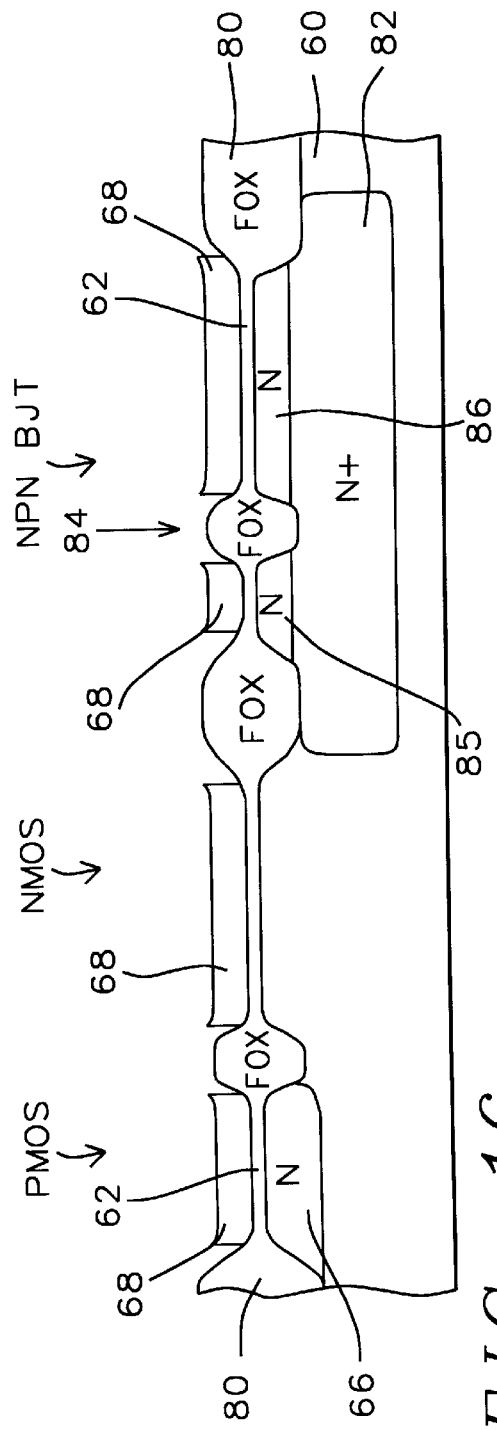
FIG. 15
FIG. 16

METHOD FOR FORMING PSEUDO BURIED LAYER FOR SUB-MICRON BIPOLAR OR BICMOS DEVICE

BACKGROUND OF THE INVENTION (1) Field of the Invention

The invention relates to the formation of bipolar junction transistors and more particularly to deep sub-micron in BiCMOS integrated circuits.

(2) Description of prior art

Recent trends in integrated circuit design have seen the re-emergence of the bipolar junction transistor(BJT) as a useful companion to the metal oxide silicon field effect transistor(MOSFET) which has dominated the technology for more than a decade. The BJT, although superior in speed and current driving capability to the MOSFET, was by-passed because of its somewhat greater cost and difficulty of manufacture, and its current and space requirements, by the MOSFET. However, in recent years, the processing advancements developed for use by complementary MOSFET (CMOS) technology, have provided a favorable environment for the incorporation of the BJTs into CMOS integrated circuits. CMOS technology makes combined use of n-channel MOSFETS (NMOS devices) and p-channel MOSFETs (PMOS devices).

The obvious utilization of BJTs is for input/output(I/O) functions while relegating the logic functions to the CMOS devices. More recently, however, bipolar devices are finding their way into the logic functions themselves in the form of BICMOS logic gates, interface drivers, and even into SRAMs(static-random-access-memories). FIG. 1, taken from Wolf, S.,"Silicon Processing for the VLSI Era", Vol.2, Lattice Press, Sunset Beach, Calif., (1995), p586, illustrates the reduction in access time of SRAMs offered by bipolar and BiCMOS technology.

The great strides made in recent years towards sub-micron definition of device components, along with the advancement of polysilicon technology have removed many of the competitive obstacles of the BJT. The technology which is now emerging from CMOS is a BiCMOS technology and involves the integration of BJTs into the CMOS environment.

Newer processing techniques developed for CMOS technology have made some of the critical features of the thin film bipolar transistor easier to control, in particular the base width and the emitter area. p- and n-wells, developed for CMOS technology, have been used to provide buried collectors for BJTs within the framework of CMOS technology without the need for epitaxial layers. Examples of BiCMOS structures formed in may be found in Wolf, S.,"Silicon Processing for the VLSI Era", Vol.2, Lattice Press, Sunset Beach, Calif., (1995), p531ff. Although such bipolar structures are easily assimilated into the CMOS process, they suffers from a high collector resistance($R_c$) as well as high collector-base and emitter-base capacitances which compromise device performance.

Generally, high performance bipolar transistors require collectors with significantly higher doping levels than can be provided by conventional, ion implanted n- and p-wells. Unfortunately the use of a heavier implant to provide the highly doped buried collector also causes a significant increase in implant damage in the region above the collector wherein the emitter and the intrinsic base regions are subsequently formed. Damage in these regions results in serious device degradation in the form of intolerable current leakage and shorts between these elements and the collector. This shortcoming of conventional ion implantation has forced many practitioners to resort to earlier and more established methods for forming high performance BJTs—that of incorporating the buried collector by the use of an epitaxial layer.

These traditional methods involve local implantation of dopant into the region of the wafer where the collector is to be formed. An epitaxial layer is then grown over the wafer. During the epitaxial growth, the implanted material diffuses into the epitaxial layer and further into the substrate silicon. When arsenic is used as the collector dopant for an npn BJT, lateral auto-doping takes place during the epitaxial growth, requiring the use of p+ junction isolation. Although antimony is less prone to lateral auto-doping, it's solid solubility in silicon is only about one-tenth that of arsenic, making it unsuitable for high dopant concentrations. The impact of problems resulting from auto-doping become more severe as device geometries become smaller. These shortcomings in addition to the increased cost of epitaxial growth itself, are major disadvantages of the use of epitaxy to form high performance sub-micron BJTs, Ford, U.S. Pat. No. 4,902,639 forms an npn BJT with a buried collector by first forming the heavily doped regions in the substrate and then growing an epitaxial layer. n- and p- wells are then formed for the CMOS devices and over the buried collector region. a heavily doped reach-through provides a low resistance contact to the buried collector element. The base and emitter regions are then formed along side the collector reach-through. Fabricius, et.al. U.S. Pat. No. 4,508,757 describes a method for reducing birds beak during the formation of isolation for a BJT having a collector buried in an epitaxial layer.

Joyce, U.S. Pat. No. 5,326,710 forms a lateral pnp BJT for a BiCMOS integrated circuit, using an epitaxial BiCMOS process which includes conventional npn BJTs wherein the heavily doped buried layer is used to provide retrograde dopant profiles for the lateral pnp BJT.

Grubisich, U.S. Pat. No. 5,580,798 uses two epitaxial layers to fabricate a BJT with a guard ring. The second epitaxial layer is used to develop the heavily doped buried collector.

The current invention takes advantage of the present day trend which reduces lateral device geometries to sub-micron levels, by performing a heavy ion implant of the collector dopant in a perimeter region of the active area of the BJT. Thus the emitter and base regions do not suffer damage from the implantation process. Subsequent lateral diffusion of the dopant during field oxide growth, forms the buried collector below the active area. Because of the small lateral geometries, complete filling of the active area is possible.

SUMMARY OF THE INVENTION

It is an object of this invention to provide a process for forming a high performance bipolar junction transistor incorporated into a BiCMOS integrated circuit with minimal alterations of the CMOS processing technology and without the use of epitaxial layers.

It is another object of this invention to provide a method for forming a high performance bipolar junction transistor having a buried collector of low resistance and of low collector to substrate capacitance without the use of epitaxial layers and without implant damage in the active device regions.

It is another object of this invention to provide a process for forming a buried collector for a high performance bipolar junction transistor without the use of epitaxial layers and without implantation of the dopant for said buried collector into semiconductive active regions subsequently occupied by the emitter or base assembly of said bipolar junction transistor.

It is yet another object of this invention to provide an improved process for forming buried semiconductive elements.

These objects are accomplished by implanting dopant for the collector into the perimeter region of the BJT and then diffusing the dopant into the active device region within the perimeter region. In the preferred embodiments, the $SiO_2$/$Si_3N_4$ oxidation hardmask which is used to form the field oxide isolation by the well known process of local oxidation of silicon(LOCOS), is first patterned to open perimeter channels over regions where BJT collectors are to be formed. A deep implant of collector dopant is then made into the exposed perimeter channels followed by an oxidation which protects silicon in the perimeter channels from exposure to RIE during a second patterning of the LOCOS hardmask.

The second patterning exposes the regions designated to receive the field oxide. During the field oxidation, the collector dopant diffuses laterally into the region enclosed by the perimeter channels, forming a continuous buried collector region. At the same time the dopant diffuses upward to meet the growing field oxide, thereby isolating the BJT.

BRIEF DESCRIPTION OF THE DRAWINGS

FIG. 1 illustrates the improved reduction in access time of SRAMs offered by BiCMOS technology.

FIG. 2 is a cross section of an in process silicon wafer showing a masking pattern used in the process of this invention.

FIG. 10 through FIG. 17 are cross sections of a silicon wafers illustrating process steps for forming the devices of a BiCMOS integrated circuit utilizing the processing steps of a second embodiment of this invention.

DESCRIPTION OF THE PREFERRED EMBODIMENTS

In a first embodiment of this invention, a pseudo-buried doped region is formed within a semiconductor wafer without the use of epitaxy and without ion implantation of an area of the semiconductor lying over the doped region. An area directly over the pseudo-buried doped region, wherein a semiconductor device, for example a bipolar junction transistor, may be formed, is surrounded by field isolation.

A monocrystalline <100> oriented p-type silicon wafer having a resistivity of between about 1 and 20 ohm cm. is provided. Referring to the cross sectional view shown in FIG. 2, a silicon nitride hardmask is formed over the silicon wafer 20 by first growing a layer of silicon oxide(pad oxide) 22 to a thickness of 20 nm. or thereabout by subjecting the wafer 20 to a clean dry oxidizing ambient in a furnace at about 950° to 1050° C. A silicon nitride layer 24 about 100 nm. thick is then deposited, preferably by low pressure chemical vapor deposition (LPCVD). The procedures used in the formation of this silicon nitride hardmask are well known in the art. This type of hardmask is widely used for the local oxidation of silicon (LOCOS) to form regions of field oxide which electrically isolate subsequently formed semiconductive devices.

Figure 3:
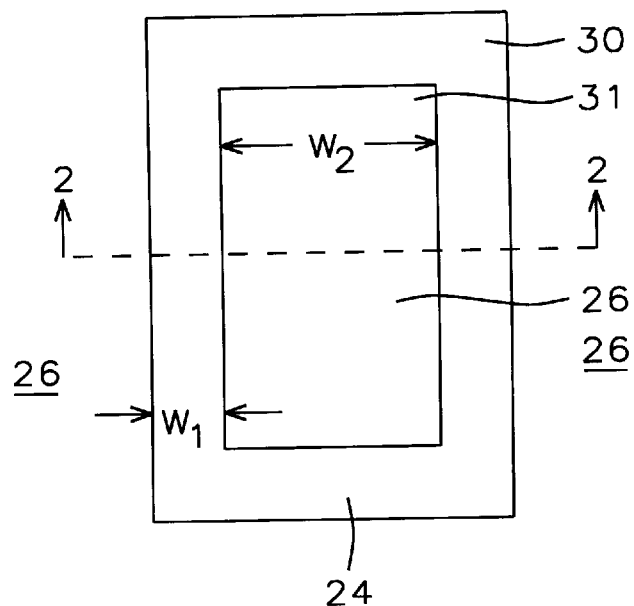
FIG. 3 is a planar view of a mask pattern used in a first embodiment of this invention.
Figure 4:
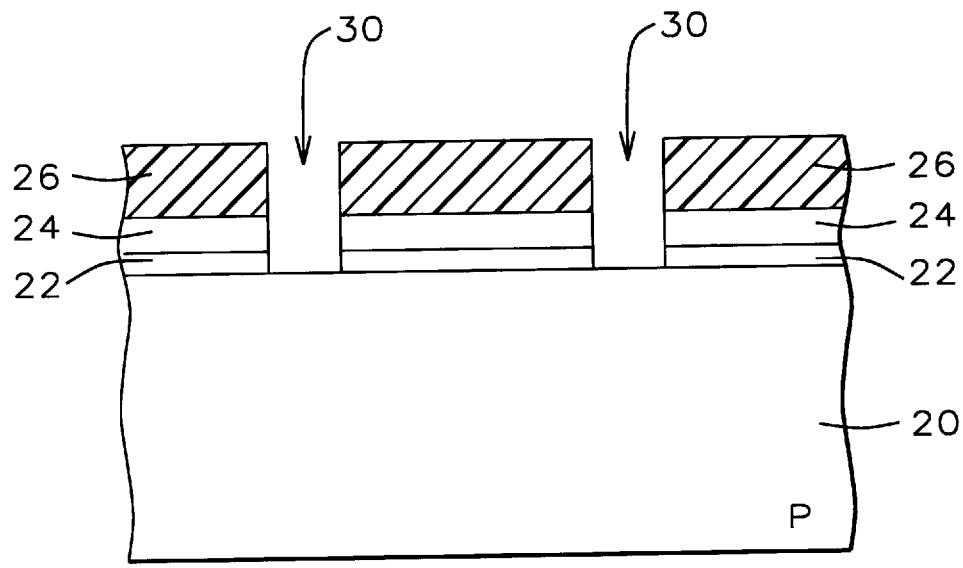
FIG. 4 through FIG. 9 are cross sections of a silicon wafer illustrating the process steps used in a first embodiment of this invention.

A layer of photoresist 26 is deposited and patterned, using well known photolithographic procedures, to define a rectangular band enclosing the region wherein the pseudo buried doped region is to be formed. FIG. 3 is a plan view of the pattern showing where the cross section 2–2' of FIG. 2 is taken. The width $w_1$ of the band 30 is between about 0.3 and 0.7 microns and the width $w_2$ of the region 31 enclosed by the band 30 is between about 0.2 and 0.7 microns.

It is to be understood that a rectangular region is used in this embodiment merely to illustrate the principle of the invention. The enclosed band 30 may be configured in another shape such as circular or oval or rectangular with rounded portions without departing from the spirit of the invention The silicon nitride hardmask 24 is next formed by etching, for example, by reactive ion etching (RIE) of the silicon nitride layer 24 exposed by the photoresist pattern. The subjacent pad oxide 22 is next removed by etching methods well known in the art, thereby exposing the silicon substrate 20 within the band 30. Alternatively the pad oxide 22 may be left in place.

Figure 5:
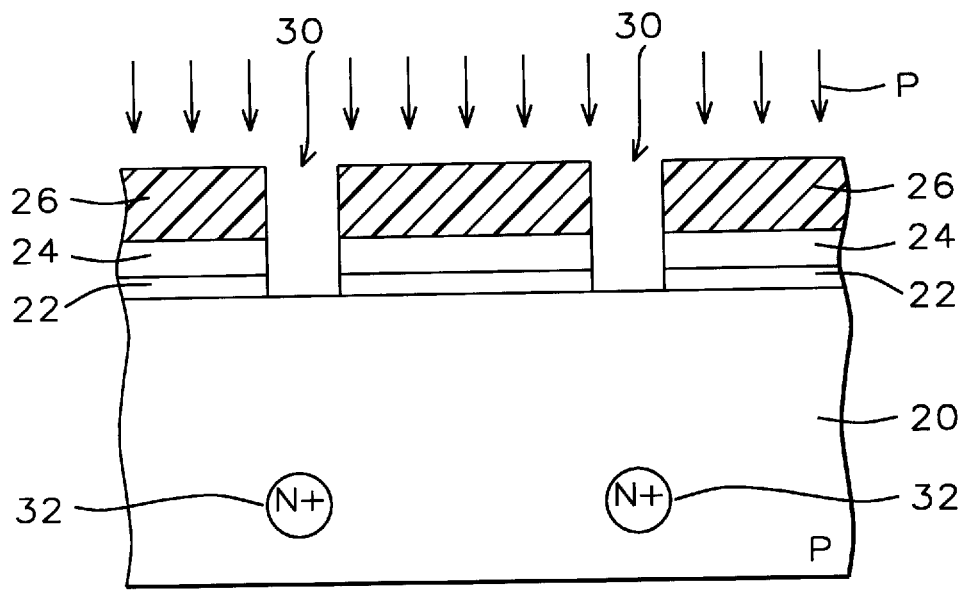
Figure 6:
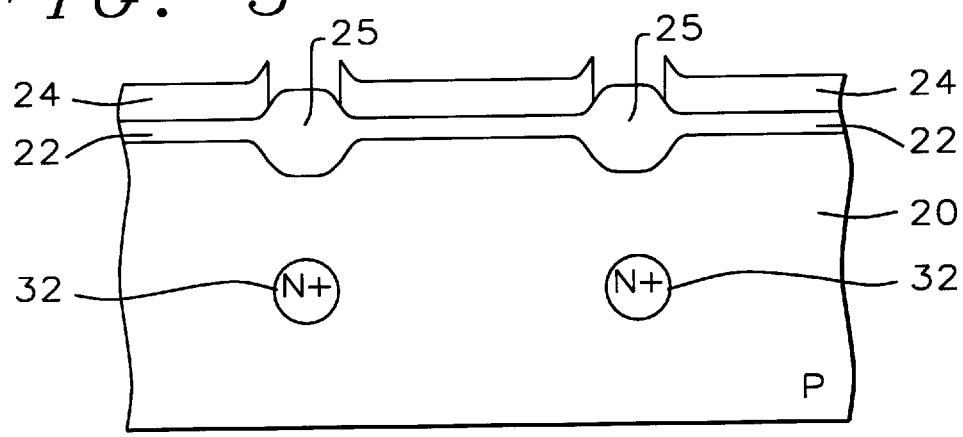

Referring next to FIG. 5, the wafer 20 is subjected to ion implantation using an n-type dopant, preferably phosphorous, to form the region 32 which has the rectangular shape of the mask pattern and is formed below the surface of the silicon wafer 20. The phosphorous is implanted at a dose of between about $5\times10^{14}$ and $6\times10^{15}$ atoms/cm$^2$ at an energy of between about 200 keV and 1 MeV. This places the center of the phosphorous distribution at approximately 0.2 and 1.2 microns below the surface of the wafer 20. Other n-type dopants such as arsenic or antimony could also be used. However, considerably higher energies would be required to achieve the same penetration as phosphorous. The photoresist mask 26 is thereafter stripped either by plasma ashing or by well known resist strippers, Referring to FIG. 6, the silicon in the mask opening 30 is thermally oxidized to provide a silicon oxide layer 25 between about 50 and 100 nm. thick. The oxidation is carried out in dry oxygen at a temperature of between about 1,000° C. and 1,200° C. The silicon oxide layer 25 protects silicon in the perimeter channels 30 from exposure to RIE during a second patterning of the LOCOS hardmask. The second patterning exposes the regions designated to receive the field oxide.

Figure 7:
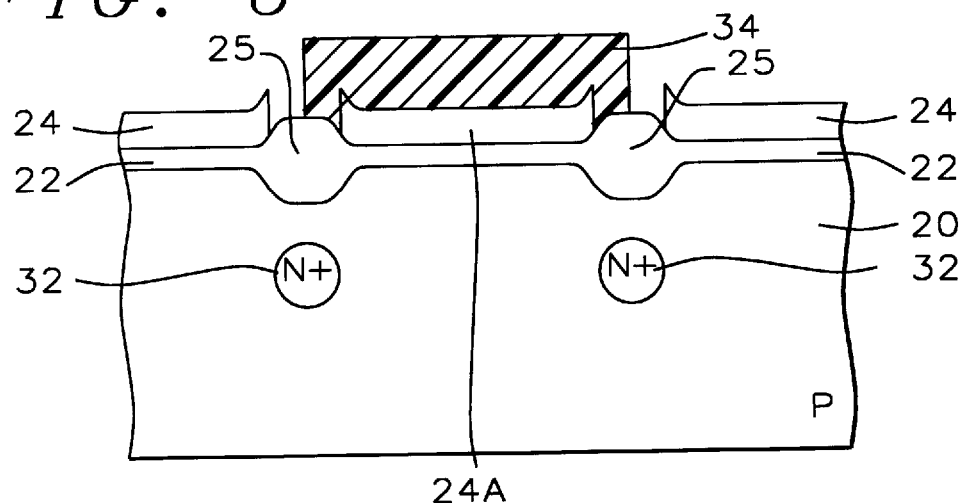

Referring to FIG. 7, a second patterning of the silicon nitride hardmask takes place. A layer of photoresist 34 is applied over the silicon nitride layer 24 and patterned to protect a portion 24A of the silicon nitride layer 24 which lies over a region of silicon wherein the pseudo buried doped region is to be formed. The remaining portion of the layer 24 not protected by the photoresist pattern 34 is etched away, preferably by RIE, leaving the mask portion 24A over the active silicon area. The portion 24A of the silicon nitride layer 24, remaining after the second patterning of the silicon nitride hardmask comprises the LOCOS field oxidation mask 24A. The photoresist layer 34 is then stripped, either by plasma ashing or with liquid strippers, and the wafer is placed in an oxidation furnace.

Figure 8:
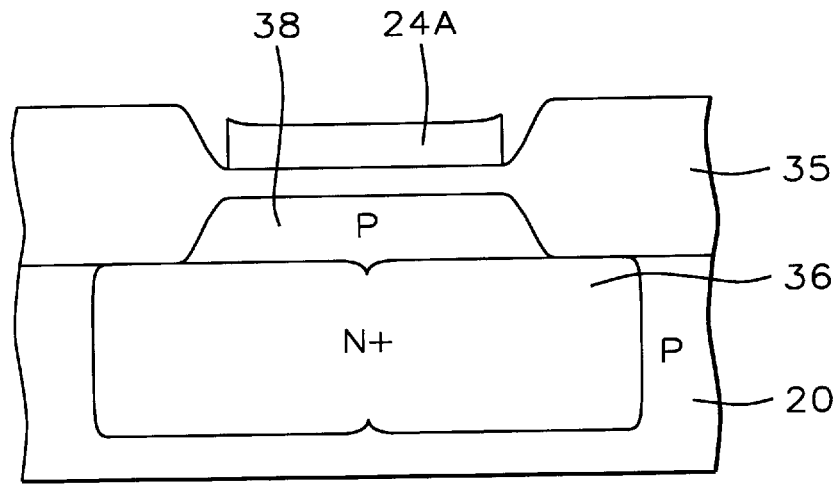

Referring to FIG. 8, the LOCOS field oxidation next performed. Typically, the field oxidation is performed at between about 950° C. and 1,100° C. using wet oxygen. During the oxidation, the phosphorous implanted region 32 diffuses upward to meet the growing field oxide isolation 35 and laterally to fill in the region below the active silicon region 38. The final diffused region 36 forms a continuous doped semiconductive element which is insulated from the substrate by junction isolation.

The temperature of the field oxidation is chosen to assure that the field oxide reaches the target thickness at the same time that the phosphourous diffuses to reach its desired shape. Alternatively a separate anneal may be used to independently drive the phosphorous to its target profile.

Figure 9:
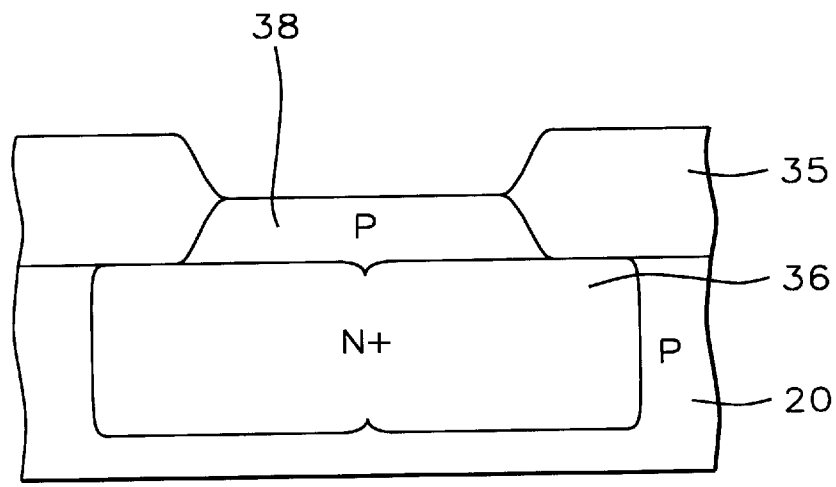

Referring to FIG. 9, the remaining hardmask 24A, is removed by well known silicon nitride etching procedures, for example, plasma etching, RIE, or by an aqueous etchant. The active region 36 is undamaged by ion implantation and is available for the formation of a semiconductive device, for example, a high performance npn bipolar transistor which utilizes the doped region 36 as a collector element.

In a second embodiment of this invention, a process for forming a BiCMOS integrated circuit with a high performance bipolar transistor is described. A heavily doped n-type buried collector element for the bipolar transistor is formed by the method of this invention within the framework of an established n-well BICMOS process without the use of epitaxial layers and with negligible implant related silicon damage in device active areas. The processing steps whereby the features of the current invention are incorporated occur early on in the BiCMOS fabrication cycle and are described in detail. Subsequent processing steps, specifically after the field oxide isolation has been formed, are accomplished by well known and widely practiced techniques and will only be outlined.

Referring to FIG. 10 there is shown a cross section of a region of the silicon wafer 60 wherein a PMOS device, an NMOS device, and a high performance npn BJT are to be formed. These components represent the semiconductive devices used in high performance BiCMOS integrated circuits. A monocrystalline <100> oriented p-type silicon wafer 60 having a resistivity of between about 1 and 20 ohm cm. is provided. A layer of silicon oxide 62 is formed over wafer 60 by thermal oxidation in dry oxygen to a thickness of between about 10 to 20 nm.

A layer of photoresist 64 is next deposited and patterned over the oxide layer 62 using well known photolithographic techniques, to define regions 66 within the surface of the silicon wafer 60 wherein an ion implant is to be performed to form an n-type well. These regions 66 are provided for the formation of a PMOS device and a BJT. The ion implant is then performed using an n-type dopant, for example phosphorous, and the n-type wells 66 are formed. The dosage and energy of this implant are of sufficiently low magnitude that negligible damage is produced in the silicon. The process of forming n-type wells is well known in the art. After the n-wells 66 are formed the residual photomask 64 is stripped using plasma ashing or a conventional liquid stripper.

Referring next to FIG. 11, a layer of silicon nitride 68 is deposited, preferably by low pressure chemical vapor deposition (LPCVD), over the silicon oxide layer 62 at a thickness of 100 nm. or thereabout. The silicon nitride layer 68 in conjunction with the pad oxide layer 62 comprises the vehicle for the well known LOCOS field oxidation hardmask. The method of formation of this mask configuration is well developed and understood and it's characteristics are determined according to the process technology in use.

Figure 12:
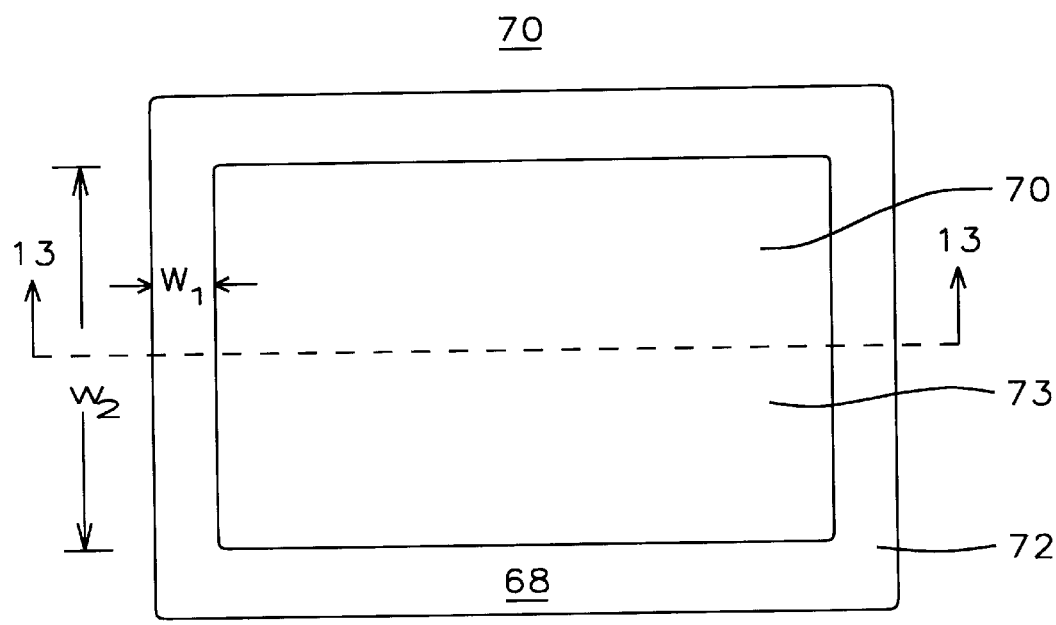

A layer of photoresist 70 is deposited over the silicon nitride layer 68 and patterned using well known photolithographic techniques. In order to accomplish the embodiments of the current invention the LOCOS field oxidation hardmask is patterned twice. The photoresist layer 70 is patterned to define an opening in the shape of a rectangular band 72 along the perimeter of the region designated for the formation of the npn BJT. FIG. 12 is a plan view of the surface of the wafer 60 which is represented in the cross section of FIG. 11. The width $w_1$ of the rectangular band opening 72 in the photoresist layer 70 is between about 0.3 and 0.7 microns. and the width $w_2$ of the smallest dimension of the photoresist island 73 enclosed by the band 72 is between about 0.2 and 0.7 microns.

Referring to FIG. 13 the silicon nitride layer 68 and the silicon oxide layer 62 are etched by RIE, using an etchant gas, for example a fluorocarbon with oxygen and then etching the pad oxide 62 with a fluorocarbon gas alone whereby the opening 72 is extended to the silicon surface.

The wafer 60 is next subjected to ion implantation using an n-type dopant, for example phosphorous, to form the region 74 which has the rectangular shape of the mask pattern and is formed below the surface of the silicon wafer 60. The phosphorous is implanted at a dose of between about $5 \times 10^{14}$ and $6 \times 10^{15}$ atoms/cm$^2$ at an energy of between about 200 keV and 1 MeV. This places the center of the phosphorous distribution at approximately 0.2 and 1.2 microns below the surface of the wafer 60. Other n-type dopants such as arsenic or antimony could also be used. However, considerably higher energies would be required to achieve the same penetration as phosphorous. The photoresist mask 70 is thereafter stripped either by plasma ashing or by well known resist strippers.

Referring to FIG. 14, the silicon in the mask opening 72 is thermally oxidized to provide a silicon oxide layer 69 between about 50 and 100 nm. thick. The oxidation is carried out in dry oxygen at a temperature of between about 1,000° C. and 1,200° C. The silicon oxide layer 69 protects silicon in the perimeter channels 72 from exposure to RIE during a second patterning of the LOCOS hardmask. The second patterning exposes the regions designated to receive the field oxide.

A layer of photoresist 76 is then applied over the silicon nitride layer 68 and patterned to define mask openings 78 for the field oxide isolation. The portion of the silicon nitride layer 68 not protected by the photoresist pattern 76 is now etched away, preferably by RIE using well known etchant gases, leaving the silicon nitride layer 68 now configured as a field oxidation mask. The remaining photoresist 76 is then stripped, either by plasma ashing or with liquid strippers. The completed LOCOS field oxidation hardmask 68 with openings 78 wherein a field oxide (FOX) is to be grown is shown in cross section in FIG. 15.

The wafer is placed in an oxidation furnace and the LOCOS field oxidation is performed. Typically, the field oxidation is performed at between about 950° C. and 1,100° C. using wet oxygen. Referring now to FIG. 16 there is shown a cross section of the BiCMOS elements after the field oxidation step. During the field oxidation, the phosphorous implanted region 74 diffuses upward to meet the growing field oxide isolation(FOX) 80 and laterally inward to fill in the region below the active regions 85 and 86. The final diffused region 82 forms a continuous doped collector element which is insulated from the substrate by junction isolation. The temperature of the field oxidation is chosen to assure that the field oxide reaches the target thickness at the same time that the phosphourous diffuses to reach its desired shape. Alternatively a separate anneal may be used to independently drive the phosphorous to its target profile.

The active regions 85 an 86 are undamaged by ion implantation and are therefore well suited for the formation of the remaining active elements of the high performance BJT. The field oxide (FOX) pocket 84, often referred to as the reach-through isolation, insulates the collector reach through contact, to be formed in the area 85, from the base/emitter portion of the BJT which is subsequently constructed in the active area 86.

The process features of the current invention have been fully incorporated at the point of BiCMOS processing thus far described, and represented by the cross section shown in FIG. 16. The heavily doped BJT collector has been formed and properly isolated by field oxide and junction isolation.

Subsequent processing steps leading to the completion of the BiCMOS semiconductive elements are accomplished using well known and established procedures inherent to BiCMOS fabrication. Because these procedures are well known and understood by those in the art, they are hereafter presented in less detail than those steps which are directly related to the current invention.

After the field oxidation step, the residual silicon nitride hardmask 68 is stripped, preferably by using RIE with an etchant gas, for example a fluorocarbon with oxygen and the pad oxide 62 is removed from over the active areas with a fluorocarbon gas alone. Other well known procedures for removing these masking materials, for example dip etching or plasma etching may be used as well.

Figure 17:
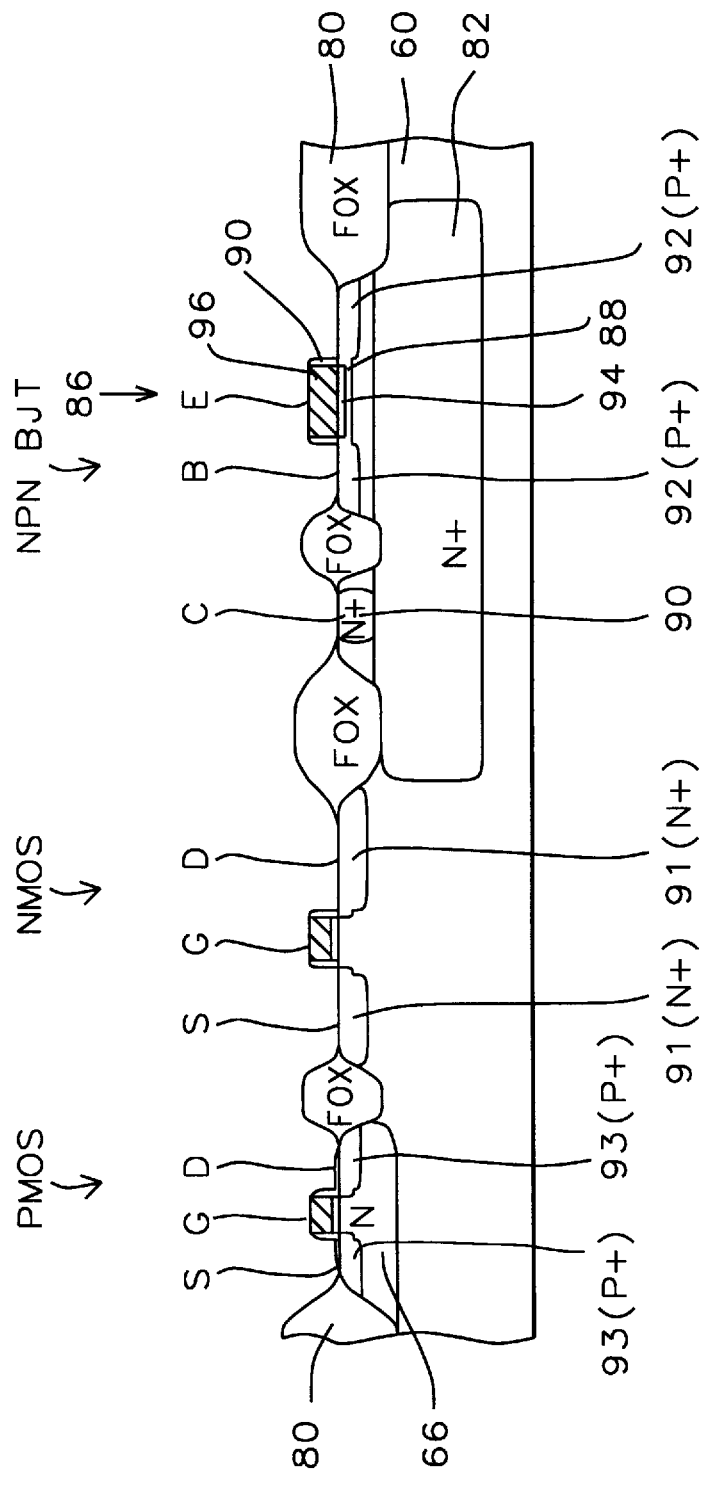

Referring now to FIG. 17, the remaining elements of the BiCMOS devices are formed using conventional BiCMOS processing technology. The intrinsic base 88 is formed by implantation of boron into the active region 86 using a photoresist mask which exposes only the region 86. The CMOS and NMOS devices are then formed using well known CMOS procedures. The collector reach-through 90 is formed by the process step in which the source/drain elements 91 of the NMOS device are formed. Similarly, the extrinsic base 92 for the npn BJT is formed by the process step in which the source/drain elements 93 of the PMOS device are formed. The well known and widely used sidewall technology is used to form the self-aligned gate LDD structures for the CMOS devices and is also applied in the formation of the self-aligned emitter 94 of the BJT.

The self-aligned emitter 94 is formed by depositing the n+ doped polysilicon emitter electrode 96 into an opening in a gate oxide layer over the intrinsic base 88. The sidewalls 90 are then formed adjacent to the emitter electrode 96 and the extrinsic base 92 is implanted by the same implantation step which forms the source/drain elements 93 of the PMOS device. A thermal annealing step drives n-type dopant from the polysilicon emitter electrode 96 into the surface of the active area forming the shallow emitter semiconductive element 94.

While this invention has been particularly shown and described with reference to the preferred embodiments thereof, it will be understood by those skilled in the art that various changes in form and details may be made without departing from the spirit and scope of the invention.

While the embodiments utilize the process of the invention to form an n-type pseudo buried semiconductive element, a p-type semiconductive element could likewise be formed using a p-type dopant material without departing from the concepts therein provided. It follows also that collector elements for pnp bipolar transistors can also be formed using the processes taught by the current invention.

What is claimed is:

1. A method for forming a buried semiconductive element in a silicon wafer comprising:

(a) providing a silicon wafer;
(b) forming a silicon oxide layer over said silicon wafer;
(c) depositing a silicon nitride layer over said silicon oxide layer;
(d) depositing a first photoresist layer over said silicon nitride layer;
(e) patterning said photoresist layer to define an opening which forms a moat around the periphery of a silicon active area wherebelow a buried semiconductive element is to be formed;
(f) etching said silicon nitride layer and said silicon oxide layer thereby extending said opening through said silicon nitride layer and said silicon oxide layer;
(g) Implanting dopant ions into said silicon wafer;
(h) stripping said first photoresist layer;
(i) thermally oxidizing said silicon wafer;
(j) depositing a second photoresist layer over said silicon wafer;
(j) patterning said second photoresist layer to cover at least a portion of said active silicon area and expose a field region surrounding said silicon active area wherein field oxide is to be formed;
(k) etching said silicon nitride layer thereby forming an oxidation hardmask;
(l) stripping said second photoresist layer; and
(m) thermally oxidizing said silicon wafer, thereby forming a field oxide isolation region and diffusing said dopant vertically to engage said field oxide isolation region and laterally under the entirety of said active area, thereby forming a continuous buried semiconductive element.

2. The method of claim 1 wherein said second silicon oxide layer is between about 50 and 100 nm. thick.

3. The method of claim 1 wherein said moat is rectangular in shape, thereby enclosing a rectangular active area, and having a width of between about 0.3 and 0.7 microns.

4. The method of claim 3 wherein the smaller dimension of said rectangular active area is between about 0.2 and 0.7 microns.

5. The method of claim 4 wherein said silicon wafer is p-type.

6. The method of claim 5 wherein said buried semiconductive element is a collector of a npn bipolar junction transistor.

7. The method of claim 5 wherein said dopant are phosphorous and are implanted at a dose of between $5 \times 10^{14}$ and $6 \times 10^{15}$ atoms/cm$^2$ and at an energy of between about 200 keV and 1.0 MeV.

8. The method of claim 4 wherein said silicon wafer is n-type.

9. The method of claim 8 wherein said buried semiconductive element is a collector of a pnp bipolar junction transistor.

10. The method of claim 8 wherein said dopant ions are boron and are implanted at a dose of between $5 \times 10^{14}$ and $6 \times 10^{15}$ atoms/cm$^2$ and at an energy of between about 200 keV and 1.0 MeV.

11. A method for forming a BiCMOS integrated circuit structure comprising:

(a) providing a silicon wafer;
(b) forming a silicon oxide layer over said silicon wafer;
(c) depositing a first photoresist layer over said silicon oxide layer;
(d) patterning said first photoresist layer to expose at least one PMOS device region and at least one bipolar transistor region;

(e) forming an n-well in said at least one PMOS device region and in said at least one bipolar transistor region;

(f) striping said first photoresist layer;

(g) depositing a silicon nitride layer over said silicon oxide layer;

(h) depositing a second photoresist layer over said silicon nitride layer;

(i) patterning said second photoresist layer to define an opening which forms a moat around the periphery of each said at least one bipolar transistor region;

(j) etching said silicon nitride layer and said silicon oxide layer thereby extending said opening through said silicon nitride layer and said silicon oxide layer;

(k) Implanting dopant ions into said silicon wafer;

(l) stripping said second photoresist layer;

(m) thermally oxidizing said silicon wafer;

(n) depositing a third photoresist layer over said silicon wafer substrate;

(o) patterning said third photoresist layer to define field oxide isolation regions;

(p) etching said silicon nitride layer thereby forming an oxidation hardmask;

(q) stripping said third photoresist layer;

(r) thermally oxidizing said silicon wafer, thereby forming field oxide isolation and diffusing said dopant vertically to engage said field oxide isolation and laterally under the entirety of said at least one bipolar transistor region, thereby forming a continuous buried collector element under each said at least one bipolar transistor region;

(s) removing said silicon nitride layer and residual silicon oxide over active areas outlined by said field oxide isolation;

(t) forming at least one NMOS device;

(u) forming a PMOS device in at least one said PMOS device region;

(v) forming a base element in said at least one bipolar transistor region;

(w) forming an emitter element over said base element; and (x) forming a collector reach-through to said buried collector element in said at least one bipolar transistor region.

12. The method of claim 11 wherein said moat is rectangular in shape, thereby enclosing a rectangular active area, and having a width of between about 0.3 and 0.7 microns.

13. The method of claim 12 wherein the smaller dimension of said rectangular active area is between about 0.2 and 0.7 microns.

14. The method of claim 11 wherein said dopant ions are selected from the group consisting of phosphorous, arsenic, and antimony.

15. The method of claim 14 wherein said dopant ions are implanted at a dose of between about $5\times10^{14}$ and $6\times10^{15}$ atoms/cm$^2$ and at an energy selected to place the center of the dopant distribution at between about 0.2 and 1.2 microns below the silicon surface.

* * * * *